United States Patent

Yamada et al.

Patent Number: 5,817,172
Date of Patent: Oct. 6, 1998

[54] PREPARATION OF OXIDE CRYSTALS

[75] Inventors: Yasuji Yamada, Nagoya; Yusuki Niiori, Inuyama; Yoshiaki Ito, Nagoya; Yutaka Yoshida, Nagoya; Izumi Hirabayashi, Nagoya, all of Japan

[73] Assignee: NGK Insulators, Ltd., Nagoya, Japan

[21] Appl. No.: 739,758

[22] Filed: Oct. 29, 1996

[30] Foreign Application Priority Data

Oct. 30, 1995 [JP] Japan .................................. 7-282162

[51] Int. Cl.$^6$ .................................. C30B 13/26
[52] U.S. Cl. .................................. 117/41; 117/37; 117/40
[58] Field of Search .................. 117/37, 40, 41; 505/1

[56] References Cited

U.S. PATENT DOCUMENTS

| | | | |
|---|---|---|---|
| 5,055,445 | 10/1991 | Belt et al. | 505/1 |
| 5,162,297 | 11/1992 | Terashima et al. | 505/1 |
| 5,444,040 | 8/1995 | Kojima et al. | 505/238 |

OTHER PUBLICATIONS

"A Chemical And Voltammetric Study of Halogens Containing Phases of the Yttrium Barium Copper Oxide Halides".; Zakharchuk, N.F., et al; High–Temp Supercond. Proc. ICMC 190 Top–Conf. Mater. Aspect; vol. 2 pp. 725–730. 1990. * (Abstract only)!

"Superconductivity And the Structure of Yttrium Barium Copper Oxide ($YBa_2Cu_3O_6$) Ceramics And Single Crystals Treated In Halogen Vapors;" Ospian, Yu, et al; Inst. Solid State Phs, Physical (Amsterdam); 1989 pp. 162–164. *(Abstract only!).

Koichi Watanabe, "An approach to the growth of $YBa_2Cu_3O_{7-x}$ single crystals by the flux method. II", Jnl of Crystal Growth, 114 (1991) pp. 269–278.

*Primary Examiner*—Felisa Garrett
*Attorney, Agent, or Firm*—Kubovcik & Kubovcik

[57] ABSTRACT

For the solution growth, a solvent is used which is composed of a mixture of an oxide containing at least one member of those elements which constitute the oxide crystal and a halide containing at least one member of those elements which constitute the oxide crystal. The process enables the temperature of crystal growth to be lowered to a significant extent, avoids inclusions such as impure anionic elements from getting intruded into the oxide crystal, while retaining adequate crystal growth through solution growth, and affords, in spite of an atmospheric mode of crystal growth and with the pinning force of magnetic flux used to advantage, the same level of beneficial effects as in a mode of crystal growth at a low oxygen pressure.

13 Claims, 4 Drawing Sheets

PREPARATION OF OXIDE CRYSTALS

BACKGROUND OF THE INVENTION

1. Field of the Invention

The present invention relates to a process for the preparation of oxide crystals by means of solution growth. More particularly, the invention relates to a process for preparing, at low temperature, superconductive crystals and analogues having the same type-crystal structure as do the first-mentioned crystals.

2. Description of Related Art

In preparing high-temperature superconductive oxide crystals and their analogous crystals through solution growth, it is known that stable, large crystals of high quality can be obtained with use of, as a solvent, an oxide melt (a self-flux) of those elements which constitute an oxide crystal to be desired.

As for the solution growth of crystals, the temperature at which a crystal proceeds to grow is always lower than the temperature at which a solution melts. When a solvent and a solute are held in eutectic relation to each other (in general, a solvent for use in solution growth forms together with a solute an eutectic system), the melt temperature of the resulting solution becomes lower, the lower the melt temperature of the solvent is. In the case of conventional processes for preparing high-temperature superconductive oxide crystals by use of an oxide melt as a solvent, and also for preparing oxide crystals analogous to the first-mentioned crystals by means of solution growth, the melt temperature of the solvent is substantially equal to the eutectic temperature of the mating solute. This is taken to mean that the melt temperature of the oxide solvent is the lowest possible or otherwise critical temperature in a known mode of solution growth using an oxide melt.

In the formation of a $YBa_2Cu_3O_{6+x}$ crystal that is one typical example of high-temperature superconductive oxide crystals, the temperature of crystal growth reaches 970° C. even in its low limit when a 3BaO–5CuO oxide is used as a solvent. This temperature is beyond the melt temperature of metallic silver which, therefore, is not feasible in such a process for crystal preparation.

Many attempts have been made by the use of certain different solvents, say an oxide melt containing anionic elements other than the elements making up a desired oxide crystal, and a halide melt. Most instances, however, fail to achieve adequate crystal growth or provide a crystal as desired, or to produce a crystal involving impure anionic elements.

With further respect to formation of another typical high-temperature superconductive oxide crystal, $Nd_{1+y}Ba_{2-y}Cu_3O_{6+x}$, it is required that the partial pressure of oxygen during crystal growth be controlled at a low level in order to provide a crystal which is adjustable in its pinning force of magnetic flux.

SUMMARY OF THE INVENTION

In view of the foregoing problems of the prior art, an object of the present invention is to provide a process for preparing an oxide crystal which enables the temperature of crystal growth to be reduced or lowered to such an extent as to utilize not only low-melting materials such as metallic silver and the like that have heretofore been unacceptable for use, but also materials that are unstable at high temperatures.

Another object of the present invention is to provide a process for preparing an oxide crystal which can avoid inclusions such as impure anionic elements from getting intruded into the desired oxide crystal, while retaining adequate crystal growth through solution growth and which can afford, in spite of an atmospheric mode of crystal growth and with the pinning force of magnetic flux used to advantage, the same level of beneficial effects as in a mode of crystal growth at a low oxygen pressure.

According to an important aspect of the present invention, there is provided a process for preparing an oxide crystal by means of solution growth using a solvent, the solvent comprising a mixture of an oxide containing at least one member of those elements constituting the oxide crystal and a halide containing at least one member of those elements constituting the oxide crystal.

DESCRIPTION OF THE PREFERRED EMBODIMENTS

Figure 1:
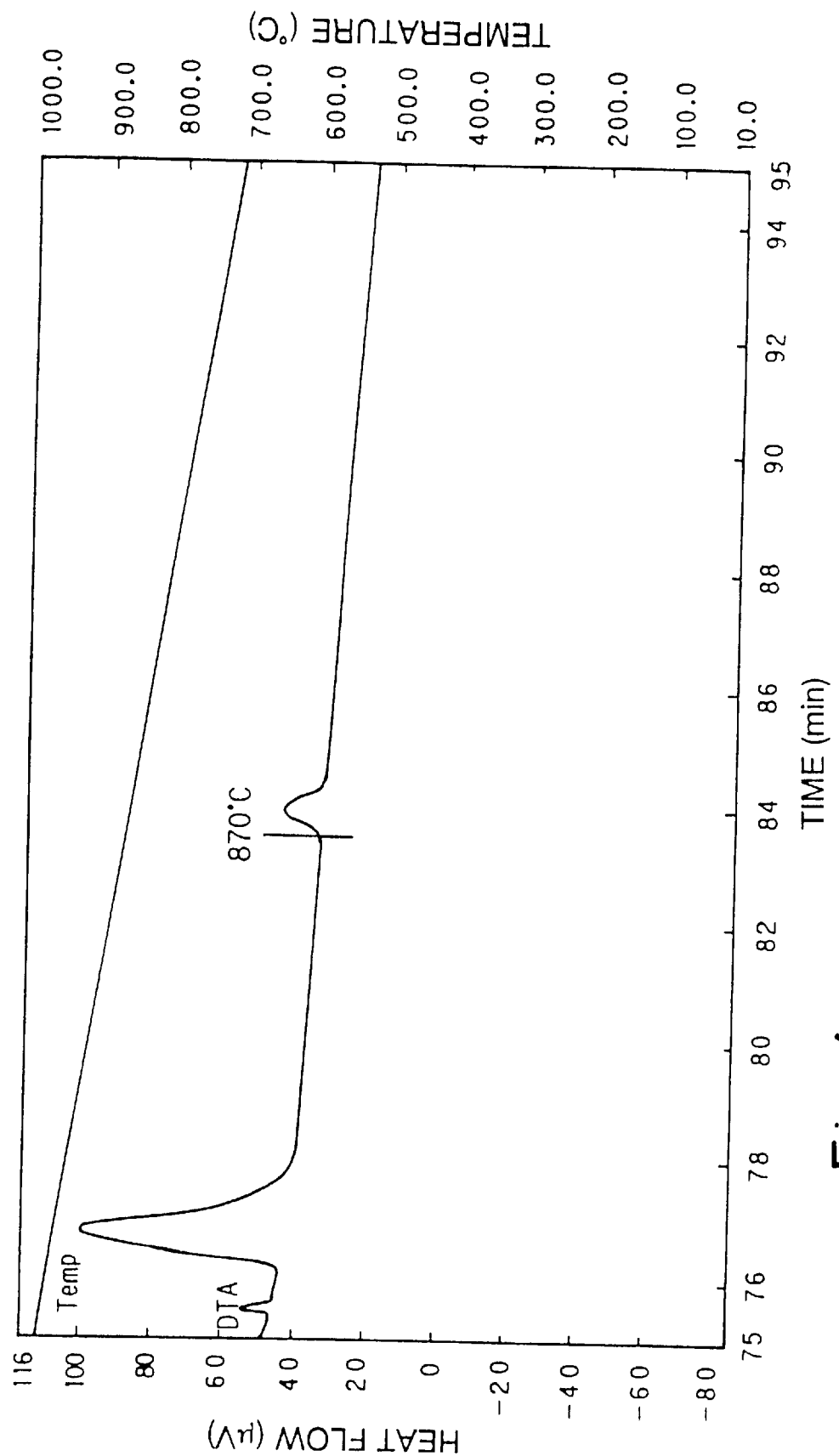
FIG. 1 is a graphic representation showing a DTA curve of endothermic peaks due to the generation of melts obtained in Example 1.

The present invention will now be described in greater detail.

To prepare high-temperature superconductive oxide crystals or their analogues by means of solution growth as of a solution standing cooling method (a flux method), a traveling solution selecting growth method (a TSSG method), a traveling solvent floating zone method (a TSFZ method) or the like, the invention contemplates using, as a solvent for solution preparation, a solvent composed of those anionic elements which constitute a desired oxide crystal, for example, an oxide solvent such as Ba—Cu—O for forming a $YBa_2Cu_3O_{6+x}$ crystal, in combination with a halide such as a fluoride, a chloride, an iodide or the like which is composed of those anionic elements which constitute the desired oxide crystal. This specified solvent has the advantage that it renders crystal growth feasible at lower temperatures, giving rise to an oxide crystal that has freedom from impure anionic elements.

Oxide crystals accruing from the present invention include superconductive crystals of the so-called Y123 crystal structure, such as a $YBa_2Cu_3O_{6+x}$ crystal and the like, and analogous crystals having the same type-crystal structure as the first-mentioned crystals do.

The oxide crystals stated above are typified by those having a composition of $(Re_{1-x}Re'_x)Ba_2Cu_3O_{6+d}$ (0<x<1.0) where Re and Re' are different from each other, and Re and Re' each are one anionic element selected from among Y, Ca, La, Pr, Nd, Sm, Eu, Gd, Dy, Ho, Er, Tm, and Yb, and those having a composition of $Re_{1+x}Ba_{2-x}$–$Cu_3O_{6+d}$ (0<x<1.0) where Re is one anionic element selected from among Y, Ca, La, Pr, Nd, Sm, Zu, Gd, Dy, Ho, Er, Tm and Yb.

The solvent eligible for the present invention comprises as one of its components an oxide that contains at least one of the elements constituting a desired oxide crystal. To be more specific, the oxide is such containing at least one anionic element chosen from Ba, Cu, Y, Ca, La, Pr, Nd, Sm, Eu, Gd, Dy, Ho, Er, Tm and Yb as already described as the constituent elements of the oxide crystal. For example, a mixture of BaO—CuO is preferable.

In addition to the above noted oxide, the solvent according to the invention comprises a halide that contains at least one of the elements constituting a desired oxide crystal. More specifically, the halide is such containing at least one anionic element chosen from Ba, Cu, Y, Ca, La, Pr, Nd, Sm, Eu, Gd, Dy, Ho, Er, Tm and Yb as already indicated as the constituent elements of the oxide crystal. The halide is composed of an alkali metal or an alkaline earth metal which may preferably be chosen from $BaF_2$, $BaCl_2$, $BaI_2$, $CaF_2$, $CaCl_2$, $CaI_2$, $SrF_2$, $SrCl_2$ and $SrI_2$.

In formulating a solvent that can be used to prepare a solution in the practice of the present invention, it is preferred that a given oxide and a given halide be mixed in a ratio of 0.1 to 50% in terms of the molar ratio of a halogen element relative to all the elements present in that solvent, preferably of 3 to 30%, more preferably of 5 to 15%. The solvent thus obtained ensures that the temperature of crystal growth be lowered to a significant extent with sufficient growth of a stable crystal.

Commonly known in the art are a solution standing cooling method (a flux method), a traveling solution selecting growth method (a TSSZ method), a traveling solvent floating zone method (a TSFZ method) and the like that may be suitably employed as a mode of crystal growth according to the present invention. These methods are disclosed for instance in "Advanced Electronics Series I-4, Category I: Electronic Materials, Properties and Devices", Takuo Sugano et al.; "Technology of Bulk Crystal Growth", Keigo Hikawa, Baifukan Publishing Co., May 20, 1994; "Handbook of Crystal Growth", Elsevier Science Publishers, 1993; and "Physical Engineering Experiment 12: Basic Technology of Crystal Growth", 2nd Ed., Shinichiro Takase, Tokyo University Publishing Institute, May 20, 1980.

Each of the above methods is outlined hereunder. By the solution standing cooling method (the flux method) is meant a method in which a solid phase to be desired is dissolved in a suitable solvent and then cooled in quietly slow condition for subsequent crystallization by taking advantage of the variations in temperature depending on varying solubilities. This method is advantageous in that it allows for crystal growth to be carried out at low temperature as contemplated to be attained by the present invention. In such a crystal as of a Y123 crystal that undergoes melting upon decomposition and hence needs cooling out of a certain temperature exceeding the decomposition temperature, those inclusions induced from a crystallization reaction are necessarily drawn into the resulting crystal. The unique solvent according to the invention is highly conducive to a single crystal free from inclusions tending to take place in a region of temperatures lower than the decomposition temperature.

The traveling solution selecting growth method (the TSSG method) is devised such that crystal growth is selectively commenced at from a seed crystal brought into contact with the surface of a solution which has been prepared by the use of a solvent for lowering the temperature of crystal growth, and such crystal growth is continuously effected while a growing crystal is being upwardly taken. The TSSG method is generally classified into two modes. One or first mode lies in lifting a crystal with cooling, while the other or last mode takes up a crystal out of a solution maintained with a temperature gradient and without temperatures varied with time. The first mode is so constructed as to start crystal growth at a nucleus put in place on the solution surface in the above solution standing cooling method. The last mode is called a temperature differential traveling solution selecting growth method, and in this mode, crystal growth is retained since a solute is being transported to a growing crystal from a starting material charged at a bottom portion of a crucible. The traveling solution selecting growth method warrants greater crystal diameters with use of crucibles of larger dimensions.

The traveling solvent floating zone method (the TSFZ method) is an improved form of a floating zone method. The TSFZ method is such in which a rod-like specimen vertically disposed is partially locally heated to define a floating zone that is thereafter traveled to form a single crystal. When taken with the floating zone placed as a boundary, the rod has a growing crystal at one of its ends and a starting material at the opposite end. As the floating zone travels, a crystal grows to correspond to a quantity of the rod having melted. The TSFZ method has been frequently desirable for high-melting materials and also widely acceptable for the formation of crystals that may pose adverse reactions with the associated crucibles. As previously discussed in connection with the solution standing cooling method, those materials which melt upon decomposition require use of a solvent. A method modified in its floating zone to be made up of a solvent is the traveling solvent floating zone method. With the TSFZ method provided, an elongate single crystal in principle can be formed since a starting material is supplied out of a starting material rod so as to replenish the amount of a crystal grown.

EXAMPLES

Example 1

The solubility of a BaO—CuO—$BaF_2$ solvent at low temperature was examined by differential thermal analysis (DTA). The elements of the solvent were weighed such that the weight ratio of BaO: CuO: $BaF_2$ was set to be 49.0: 46.1 : 4.9 and mixed together. The resulting specimen was heated with a temperature rise of 15° C. per minute and then measured in respect of its endothermic peaks due to the generation of melts. A first endothermic peak appeared at approximately 870° C., and the relevant data (DTA curve) is shown in FIG. 1.

Figure 2:
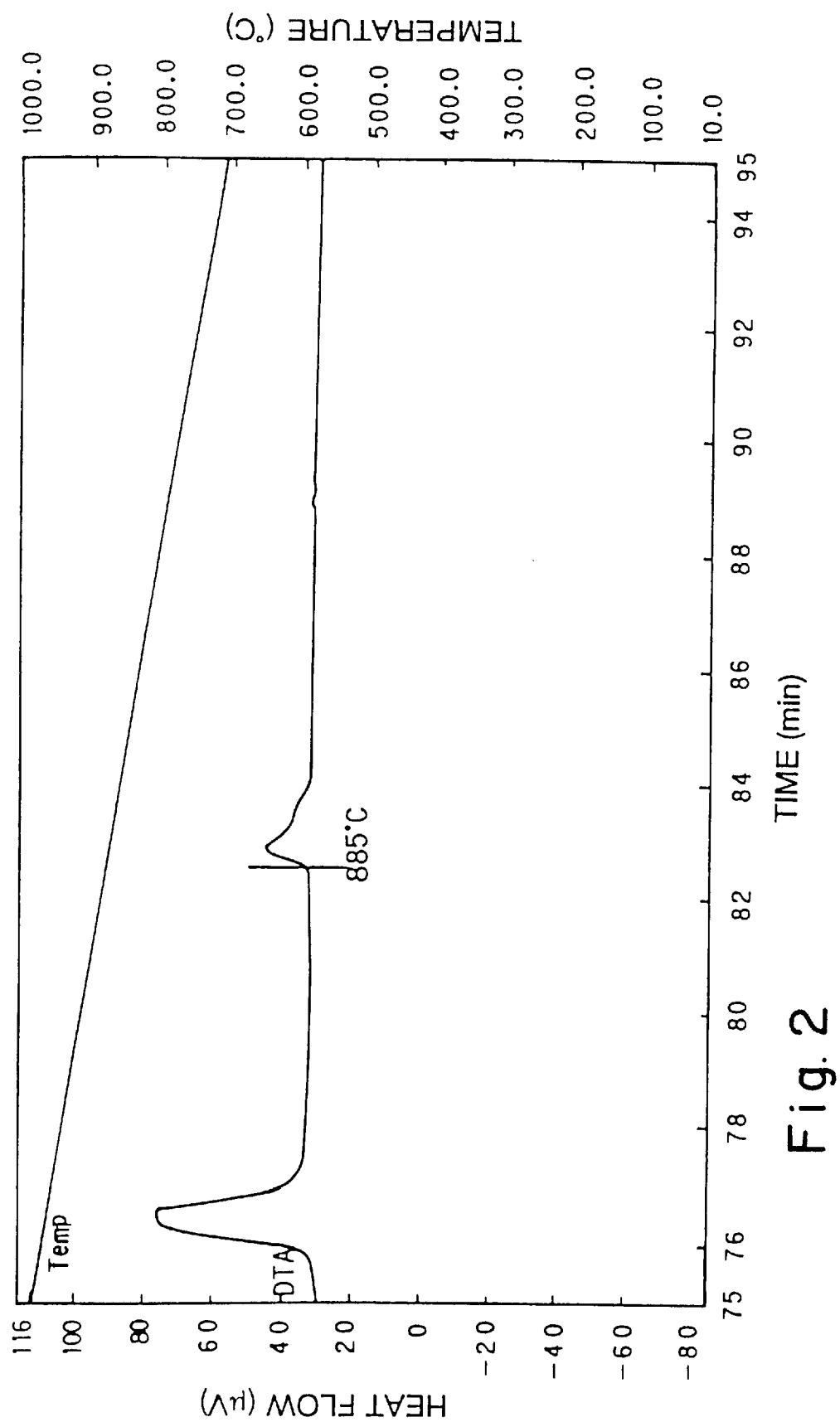
FIG. 2 is a graphic representation showing a DTA curve of endothermic peaks due to the generation of melts devoid of a halide.

To facilitate comparison, the data on a case with no fluoride (BaO: CuO=53.6: 46.4) is given in FIG. 2. In this comparative case, a first melt was generated at about 885° C. A case with addition of a fluoride generates a melt at a lower temperature and thus have proved to be adequate as a solvent for solution growth.

Example 2

Figure 3:
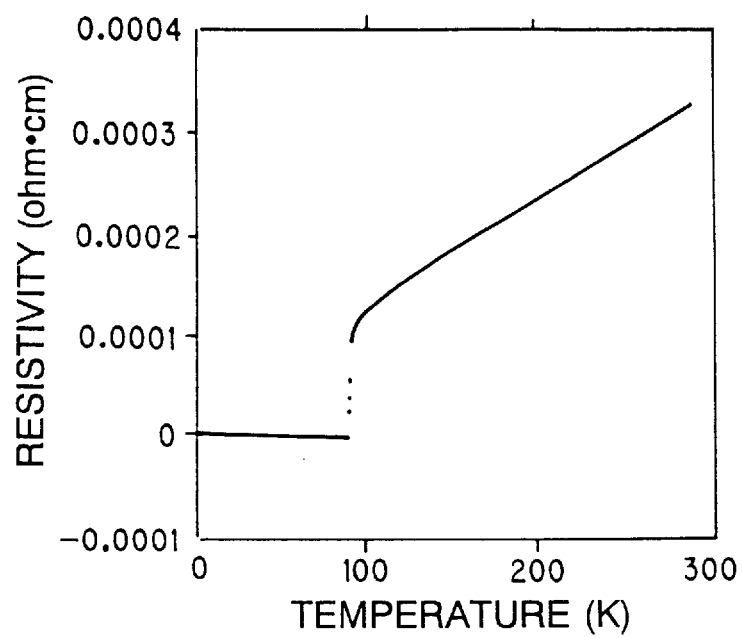
FIG. 3 is a graphic representation showing the relationship between the resistivity and the temperature as concerns a crystal provided in Example 2.

An oxide crystal having a crystal structure of a Y123 type was allowed to grow with use of an oxide-fluoride solvent. In an yttria-made crucible were placed 100 g of $YBa_2Cu_3O_{6+x}$ (Y123), 43 g of BaO, 40 g of CuO and 4 g of $BaF_2$, and the whole was heated at 900 to 1,000° C. in an electric furnace to thereby obtain a solution for crystal growth. The growth of a Y123 crystal was carried out by a traveling solution selecting growth method (the TSSG method) and with varying temperatures at the level of the solution, and the range of temperatures at which to grow the Y123 crystal was determined. A seed crystal employed here was a crystalline membrane of the Y123 crystal disposed over a substrate of MgO formed by a pulse laser deposition method (the PLD method). This membrane was brought into contact with the solution level and caused to grow for 10 minutes with rotating at 100 rpm. The growth of the Y123 crystal was observed in a temperature range of 945° to 989° C. As to the resulting crystal after being annealed in an oxygen stream, the relationship between the resistivity and the temperature is viewed in FIG. 3. The crystal tested here was provided with superconductivity at below 100 K and has been identified to be a desired $YBa_2Cu_3O_{6+x}$ crystal as evidenced by FIG. 3.

On the other hand, where crystal growth was done with $BaF_2$ omitted, a Y123 crystal revealed a temperature range of crystal growth of 968° to 1,007° C. This means that addition of a fluoride solvent or $BaF_2$ to oxide solvents or BaO and CuO can grow an oxide crystal, $YBa_2Cu_3O_{6+x}$, at a lower temperature.

Example 3

Figure 4:
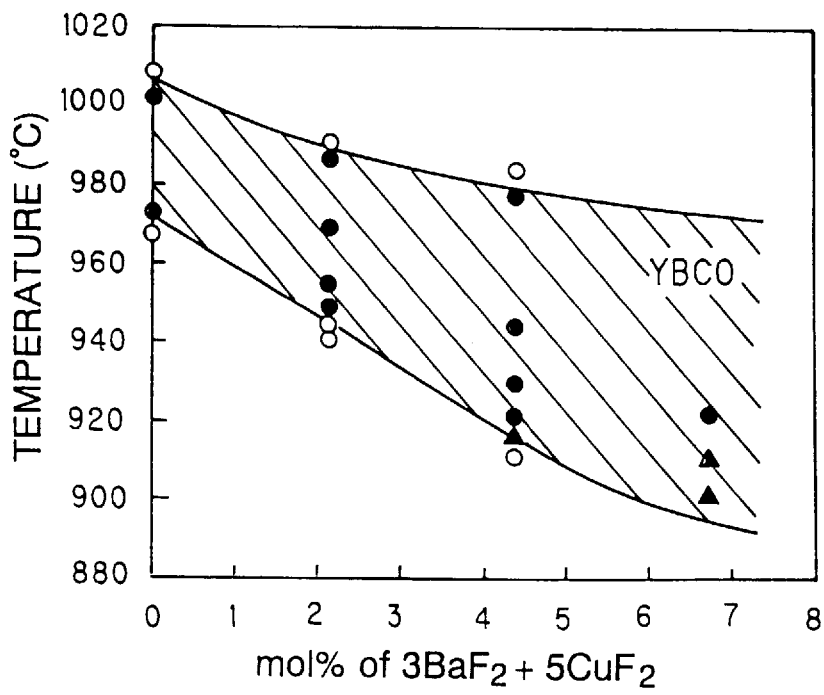
FIG. 4 is a graphic representation showing the temperature range of crystal growth of a Y123 crystal with varied ratios of an oxide and a fluoride to be mixed as a solvent.

Examination was made of the temperature range of crystal growth of a Y123 crystal under the same crystal growth conditions as employed in Example 2 but with varying ratios of an oxide and a fluoride to be mixed as a solvent. The results are shown in FIG. 4. In this figure, the oxide to fluoride ratio is expressed in a molar ratio of $(3BaF_2-5CuF_2)$ with respect to $(3BaO-5CuO)$ as an oxide solvent and $(3BaF_2-5CuF_2)$ as a fluoride solvent. As is clear from FIG. 4, the growth of the Y123 crystal is possible at a lower temperature by the use of the fluoride solvent.

Less than a 0.1% amount of fluorine (equivalent to 0.10005% in FIG. 4) to be added to all the elements present in the solvent is ineffective in producing significant results. As the amount of fluorine is increased, crystal growth at low temperature is improved, and the best results are made available in the vicinity of a 6% amount of fluorine (equivalent to 6.1856% in FIG. 4). Larger amounts of fluorine result in gradual instability of the stationary Y123 crystal, and more than a 50% amount of fluorine (equivalent to 66.6% in FIG. 4) has been found to adversely inhibit the Y123 crystal against growth.

Example 4

An oxide crystal having a crystal structure of a Y123 type, $(Y_{1-d}Ca_d)Ba_2Cu_3O_{6+x}$[(Y—Ca) 123 crystal], was caused to grow by the use of an oxide-fluoride solvent.

The procedure of Example 2 was followed with the exception use of 100 g of $YBa_2Cu_3O_{6+x}$ (Y123), 70 g of BaO, 60 g of CuO and 4 g of $CaF_2$. Satisfactory crystal growth was observed at 970° C. Inspection of the resulting crystal by ICP shows that the crystal composition is identified to be $(Y_{0.84}Ca_{0.16})-Ba_2Cu_3{}_{O6+x}$.

In contrast, the (Y-Ca) 123 crystal grew satisfactorily at about 1,000° C. when with addition of CaO but with omission of $CaF_2$. It has been noted as the result that use of BaO and CuO as oxide solvents together with $CaF_2$ as a fluoride solvent makes a contribution to lowered temperature at which to grow the oxide crystal or $(Y_{1-d}Ca_d)Ba_2Cu_3O_{6+x}$ crystal [the (Y—Ca) 123 crystal].

Example 5

An oxide crystal having a crystal structure of a Nd123 type was caused to grow with use of an oxide-fluoride solvent. Into a neodya-made crucible were charged 100 g of $NdBa_2Cu_3O_{6+x}$ (Nd123), 65 g of BaO, 60 g of CuO and 6 g of $BaF_2$, and the whole was heated at from 950° to 1,050° C. in an electric furnace to thereby obtain a solution for crystal growth. The growth of a Nd123 crystal was carried out by a traveling solution selecting growth method (the TSSG method). A seed crystal used here was a crystalline membrane of the Nd123 crystal disposed over a substrate of MgO formed by the PLD method. This membrane was brought into contact with the solution level and caused to grow for 10 minutes with rotating at 100 rpm. The growth of the Nd123 crystal was observed at 1,020° C.

Figure 5:
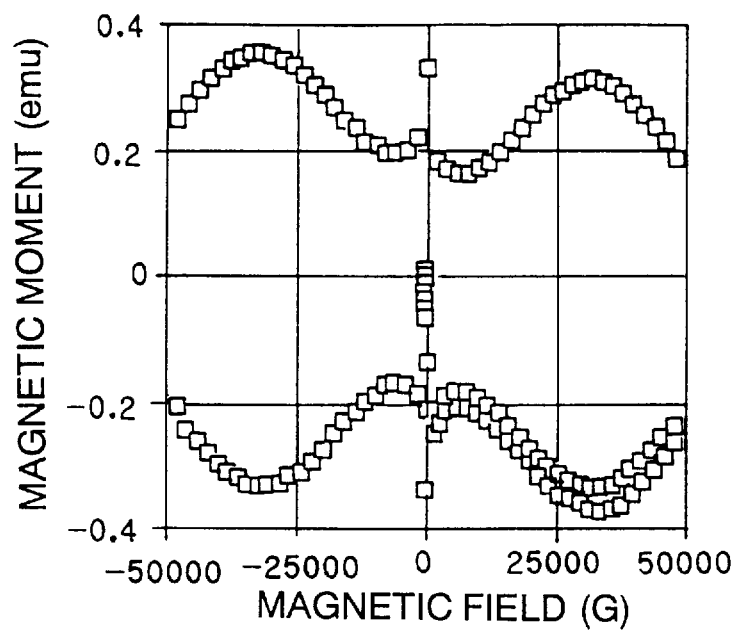
FIG. 5 is a graphic representation showing the relationship between the magnetic field and the magnetization as concerns a crystal provided in Example 5 and then subjected to annealing.
Figure 6:
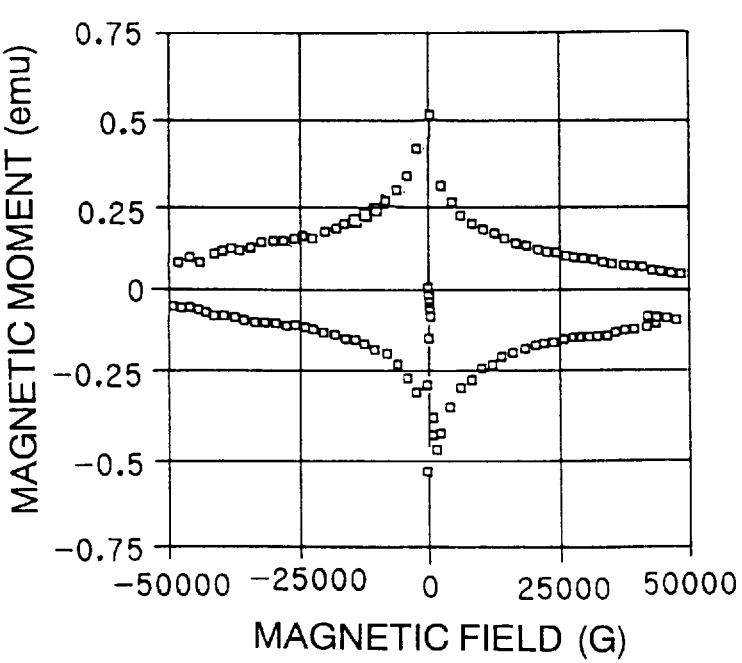
FIG. 6 is a graphic representation showing the relationship between the magnetic field and the magnetization as concerns a crystal provided in Example 5 and then subjected to slow cooling.

As for the resulting crystal after being annealed at 320° C. for 200 hours in an oxygen stream, the relationship between the magnetic field and the magnetization at 77 K is shown in FIG. 5. Though showing superconductivity transformation at 98 K, the annealed crystal revealed no peak effects as appeared from FIG. 5. When exposed to slow cooling from 600° C. to 300° C. over 200 hours in an oxygen stream, such crystal revealed conspicuous peak effects as evidenced by FIG. 6. This situation was similar to the case with the Nd crystal grown at a low partial pressure of oxygen of 1%.

On the other hand, when grown with $BaF_2$ omitted, a Nd123 crystal gave a temperature of crystal growth at 1,060° C. and provided noticeable peaks, irrespective of what conditions are employed to anneal the specimen.

From the foregoing findings, the addition of a fluoride solvent or $BaF_2$ to oxide solvents or BaO and CuO has proved highly capable of growing the Nd123 crystal at a lower temperature. It has also been found that those results obtainable from the growth at a low partial pressure of oxygen are attainable in the case with the growth in the atmosphere.

In accordance with the present invention, as stated hereinabove, an oxide crystal can be prepared through solution growth by the use of the specified solvent and with the temperature of crystal growth to be lowered to a significant extent. Moreover, in view of the pinning phenomenon of magnetic flux, those benefits obtained from the crystal growth at a low partial pressure of oxygen are likewise attainable with the crystal growth in the atmosphere.

What is claimed is:

1. A process for preparing an oxide crystal by means of solution growth in the presence of a solvent, said solvent comprising a mixture of an oxide containing at least one member of those elements which constitute said oxide crystal and a halide containing at least one member of those elements which constitute said oxide crystal.

2. The process according to claim 1, wherein said oxide crystal is selected from the group consisting of a superconductive crystal and a crystal having the same type structure as does the superconductive crystal.

3. The process according to claim 1, wherein said oxide crystal has a Y123 crystal structure.

4. The process according to claim 1, wherein said oxide crystal has a composition of $(Re_{1-x}Re'_x)Ba_2Cu_3O_{6+d}$ where Re and Re' are different from each other, and Re and Re' each are either one anionic element selected from the group consisting of Y, Ca, La, Pr, Nd, Sm, Eu, Gd, Dy, Ho, Er, Tm, and Yb, and (0<x<1.0).

5. The process according to claim 1, wherein said oxide crystal has a composition of $Re_{1+x}Ba_{2-x}Cu_3O_{6+d}$ where Re is either one anionic element selected from the group consisting of Y, Ca, La, Pr, Nd, Sm, Zu, Gd, Dy, Ho, Er, Tm and Yb, and (0<x<1.0).

6. The process according to claim 1, wherein said oxide contains at least one anionic element selected from the group consisting of Y, Ca, La, Pr, Nd, Sm, Eu, Gd, Dy, Ho, Er, Tm, and Yb.

7. The process according to claim 1, wherein said oxide comprises a mixture of BaO—CuO.

8. The process according to claim 1, wherein said halide contains at least one anionic element selected from the group consisting of Y, Ca, La, Pr, Nd, Sm, Eu, Gd, Dy, Ho, Er, Tm, and Yb.

9. The process according to claim 1, wherein said halide contains one member selected from the group consisting of alkali metals and alkaline earth metals.

10. The process according to claim 9, wherein said halide is selected from the group consisting of $BaF_2$, $BaCl_2$, $BaI_2$, $CaF_2$, $CaCl_2$, $CaI_2$, $SrF_2$, $SrCl_2$ and $SrI_2$.

11. The process according to claim 1, wherein said oxide and said halide are mixed in a ratio of 0.1 to 50% in terms of the molar ratio of a halogen element relative to all the elements present in said solvent.

12. The process according to claim 1, wherein said oxide and said halide are mixed in a ratio of 3 to 30% in terms of the molar ratio of a halogen element relative to all the elements present in said solvent.

13. The process according to claim 1, wherein said oxide and said halide are mixed in a ratio of 5 to 15% in terms of the molar ratio of a halogen element relative to all the elements present in said solvent.

* * * * *

UNITED STATES PATENT AND TRADEMARK OFFICE
CERTIFICATE OF CORRECTION

PATENT NO.   : 5,817,172
DATED        : October 6, 1998
INVENTOR(S)  : Yasuji YAMADA et al.

Page 1 of 1

It is certified that error appears in the above-identified patent and that said Letters Patent is hereby corrected as shown below:

On the cover page, left column, Item [73] Assignee,
" NGK Insulators, Ltd., Nagoya, Japan" should be
--NGK Insulators, Ltd. of Nagoya, Japan and International Superconductivity Technology Center, of Tokyo, Japan--

Signed and Sealed this

Twenty-sixth Day of June, 2001

*Attest:*

NICHOLAS P. GODICI
*Attesting Officer*   Acting Director of the United States Patent and Trademark Office